(12) United States Patent
Takada et al.

(10) Patent No.: US 10,374,582 B2
(45) Date of Patent: Aug. 6, 2019

(54) OPERATION BUTTON AND OPERATION DEVICE

(71) Applicant: FUJITSU TEN LIMITED, Kobe-shi, Hyogo (JP)

(72) Inventors: Kengo Takada, Kobe (JP); Toshiya Shirota, Kobe (JP); Takahiro Tsukada, Kobe (JP); Masao Ohtani, Kobe (JP)

(73) Assignee: FUJITSU TEN Limited, Kobe-shi (JP)

( * ) Notice: Subject to any disclaimer, the term of this patent is extended or adjusted under 35 U.S.C. 154(b) by 72 days.

(21) Appl. No.: 15/692,536

(22) Filed: Aug. 31, 2017

(65) Prior Publication Data

US 2018/0115304 A1 Apr. 26, 2018

(30) Foreign Application Priority Data

Oct. 24, 2016 (JP) .................................. 2016-207464

(51) Int. Cl.
*H01H 13/02* (2006.01)
*H01H 19/02* (2006.01)
*H03J 1/04* (2006.01)
*H01H 11/00* (2006.01)
*H01H 25/06* (2006.01)
*G11B 33/10* (2006.01)

(52) U.S. Cl.
CPC ......... *H03J 1/044* (2013.01); *H01H 11/0018* (2013.01); *H01H 19/025* (2013.01); *H01H 25/065* (2013.01); *G11B 33/10* (2013.01); *H01H 13/023* (2013.01); *H01H 2221/07* (2013.01)

(58) Field of Classification Search
CPC ........... H03J 1/044; H01H 9/16; H01H 9/161; H01H 9/181; H01H 2009/184; H01H 13/02; H01H 13/023; H01H 13/04; H01H 13/06; H01H 13/26; H01H 25/06; H01H 25/065; H01H 2221/07; H01H 13/42; H01H 19/005; H01H 2019/006; H01H 2019/008; H01H 19/025; H01H 2013/026; G05G 1/105
USPC ....................................... 362/23.05; 200/314
See application file for complete search history.

(56) References Cited

U.S. PATENT DOCUMENTS

| 7,423,886 B2 * | 9/2008 | Nishimoto | ........... H01H 19/025 200/314 |
| 2018/0330902 A1 * | 11/2018 | Takada | ................. H01H 25/008 |
| 2019/0018440 A1 * | 1/2019 | Ishimaru | .................. H01H 9/16 |

FOREIGN PATENT DOCUMENTS

| CN | 104134561 A | 11/2014 |
| JP | H06-38127 U | 5/1994 |
| JP | 2014-107024 A | 6/2014 |

OTHER PUBLICATIONS

Sep. 30, 2018 Office Action issued in Chinese Patent Application No. 201710858309.8.

* cited by examiner

*Primary Examiner* — Suezu Ellis
(74) *Attorney, Agent, or Firm* — Oliff PLC

(57) ABSTRACT

An operation button includes: a body that is in a tubular shape; a top which has a light-transmitting portion and which is attached to the body at its one end; a plurality of legs that are provided at the other end of the body at intervals from each other in the circumferential direction; and a flange arranged between the one end and the other end of the body.

8 Claims, 4 Drawing Sheets

OPERATION BUTTON AND OPERATION DEVICE

CROSS-REFERENCES TO RELATED APPLICATIONS

This application is based on Japanese Patent Application No. 2016-207464 filed on Oct. 24, 2016, the disclosure of which is hereby incorporated by reference.

BACKGROUND OF THE INVENTION

1. Field of the Invention

The present invention relates to operation buttons and operation devices.

2. Description of Related Art

JP-UM-A-06-38127 discloses an illuminating structure for an illuminated push switch in which light from a light source is guided through a light guide plate in the shape of a thick-walled flat plate to the inner-surface side of the key top of an illuminated light-transmitting key that is held in a key-holding hole formed in a housing. According to JP-UM-A-06-38127, the illuminating structure for an illuminated push switch is provided with a light-shielding layer that covers the illuminated key-side surface of the light guide plate over the area other than the part facing the illuminated key. This helps effectively prevent light leakage when the illuminated key is operated.

SUMMARY OF THE INVENTION

A light-transmitting operation button can be composed of a plurality of components. In that case, it is often necessary not only to take measures to prevent light leakage but also to give consideration to handleability during assembly. For example, some parts of an operation button requires precision. If a precision-requiring part of an operation button is deformed or contaminated with foreign matter during assembly, the operation button may not operate properly. Thus, during assembly, care needs to be taken to handle precision-requiring parts properly.

In view of the problems mentioned above, an object of the present invention is to provide an operation button and an operation device that can prevent light leakage and that provide improved handleability during assembly.

To achieve the above object, according to one aspect of the present invention, an operation button includes: a body that is in a tubular shape; a top which has a light-transmitting portion and which is attached to the body at its one end; a plurality of legs that are provided at the other end of the body at intervals from each other in the circumferential direction; and a flange arranged between the one end and the other end of the body.

To achieve the above object, according to another aspect of the present invention, an operation device includes: an operation button that is structured as described above; an operation dial that is in a ring shape surrounding the outer circumference of the operation button; a support member which supports the operation button such that the operation button is movable as the pressed surface is pressed; a light source which radiates light toward the light-transmitting portion; and a switch which is turned on and off as the operation button moves.

DETAILED DESCRIPTION OF PREFERRED EMBODIMENTS

Hereinafter, an operation button and an operation device according to an embodiment of the present invention will be described in detail.

Figure 1:
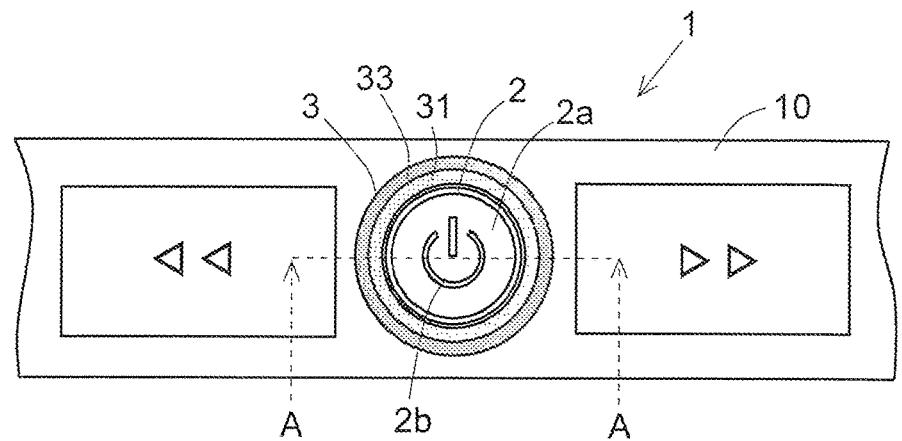
FIG. 1 is a schematic plan view of an operation device as seen from the front side.

1. Outline of an Operation Device:

FIG. 1 is a schematic plan view of an operation device 1 according to an embodiment of the present invention, as seen from the front side. More specifically, FIG. 1 shows part of the operation device 1. The operation device 1 according to this embodiment is, for example, a device from which a user can operate a vehicle-mounted audio system.

As shown in FIG. 1, the operation device 1 has a housing 10. The operation device 1 is provided with an operation button 2 in a central part of the front face of the housing 10. In this embodiment, the operation button 2 is, for example, a power button. By pressing a pressed surface 2a located on the front face of the operation button 2, the user can turn on and off the power of the audio system. The operation button 2 may be any button other than a power button, and may instead be, for example, a button that is pressed to confirm a set condition. The pressed surface 2a is not limited to a flat surface, but may be, for example, a curved surface such as a concave surface or a convex surface.

In the pressed surface 2a of the operation button 2, there is provided a light-transmitting portion 2b that transmits light. The light-transmitting portion 2b can be in the shape of, for example, a letter, a figure, or a symbol. In this embodiment, the light-transmitting portion 2b is in the shape of a symbol that represents a power button. For example, even in a dark ambience, such as during the night, light from a light source (not shown in FIG. 1) is transmitted through the light-transmitting portion 2b so that the user can visually recognize the symbol representing a power button. Thus, even in a dark environment, the user can easily recognize the location of the pressed surface 2a and press it.

As shown in FIG. 1, the operation device 1 is provided with a ring-form operation dial 3 that surrounds the outer circumference of the operation button 2. The operation dial 3 is of a rotary type. The operation dial 3 rotates about a center axis that passes through the center of the pressed surface 2a, which is in a circular shape as seen in a plan view. In FIG. 1, the center axis extends in the direction perpendicular to the plane of the figure. By adjusting the amount of rotation of the operation dial 3, it is possible, for example, to switch displayed screens. To allow smooth rotation of the operation dial 3 relative to the operation button 2, a clearance is provided between the operation dial 3 and the operation button 2.

Figure 2:
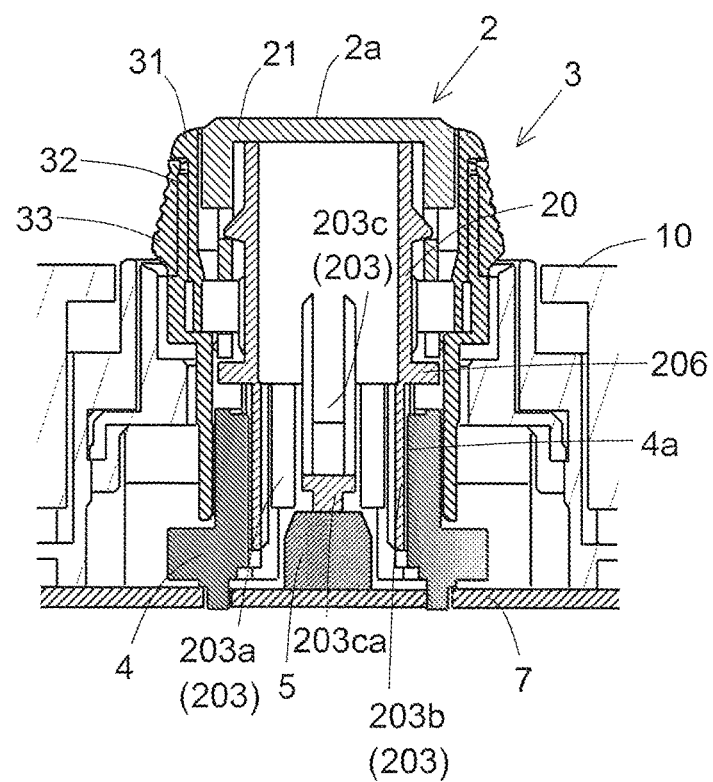
FIG. 2 is a schematic sectional view across line A-A in FIG. 1.

FIG. 2 is a schematic sectional view across line A-A in FIG. 1. As shown in FIG. 2, part of each of the operation button 2 and the operation dial 3 protrudes from the surface of the housing 10 constituting the operation device 1. More specifically, the ring-form operation dial 3 has three rings 31, 32, and 33 that are arranged in this order from the inner circumference side to the outer circumference side. The three rings 31 to 33 are fixed to each other to be integrated together. In the following description, of the three rings 31 to 33, the innermost ring 31 will be called the inner ring, the outermost ring 33 will be called the outer ring, and the ring 32 held between the inner and outer rings 31 and the 33 will be called the middle ring.

Almost the entire outer ring 33 is located outside the housing 10. The hand of the user who operates the operation dial 3 makes contact chiefly with the outer ring 33. The inner ring 31 and the middle ring 32 extend deeper into the housing 10 than the outer ring 33 does. In this embodiment, about one-half of the inner ring 31 is located inside the housing 10. A large part of the entire middle ring 32 is located inside the housing 10.

The inner ring 31 has its entire surface plated. Thus, the operation dial 3 has a plated surface at its inner circumference. In a structure where the inner circumference is plated, it is possible, by increasing the plated area, to increase the strength of the plating. In the operation dial 3, the inner ring 31, which is plated, extends deep into the housing 10, and is formed in a large size. This helps improve, in the operation dial 3, the strength of the plated part, and makes it unlikely to be broken.

As shown in FIG. 2, the operation device 1 is provided with a support member 4 that supports the operation button 2 such that the operation button 2 is movable as the pressed surface 2a is pressed. The support member 4 is arranged inside the housing 10. In a central part of the support member 4, an opening 4a in a circular shape is formed. The operation button 2 is supported on the support member 4 as a result of part of the former being inserted in the opening 4a.

In this embodiment, the support member 4 engages with the middle ring 32 to support the operation dial 3 such that the operation dial 3 is rotatable. In this embodiment, the support member 4 is an encoder. Using an encoder as the support member 4 makes it possible to measure the rotation angle of the operation dial 3. Using an encoder as the support member 4 makes it possible to arrange the operation button 2 and the operation dial 3 efficiently in a narrow space. The encoder 4 is arranged on a circuit board 7 provided in the operation device 1. The encoder 4 is electrically connected to electrical wiring formed on the circuit board 7.

As shown in FIG. 2, the operation device 1 is provided with a switch 5 that is turned on and off as the operation button 2 moves. The switch 5 is arranged on the circuit board 7. The switch 5 is electrically connected to the electrical wiring formed on the circuit board 7. When the user presses the pressed surface 2a, part of the operation button 2 presses the switch 5. The pressing allows the switch 5 to be switched between on and off. The switch 5 is elastic, so that when the user removes the force pressing the pressed surface 2a, the operation button 2 is pushed back by the switch 5. That is, the switch 5 is released from the pressed state.

Figure 3:
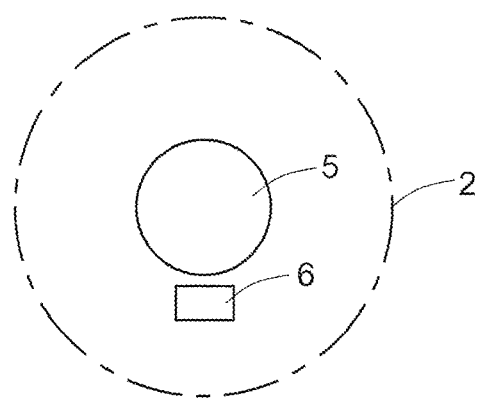
FIG. 3 is a schematic plan view showing a switch along with its surroundings.

FIG. 3 is a schematic plan view showing the switch 5, along with its surroundings, provided in the operation device 1 according to an embodiment of the present invention. In FIG. 3, a dash-and-dot line represents the inner circumferential surface of the operation button 2. As shown in FIG. 3, the operation device 1 is provided with a light source 6 beside the switch 5. The switch 5 and the light source 6 are located inward of the inner circumferential surface of the operation button 2 when the operation device 1 is seen from the front side (when it is seen, in FIG. 1, along the direction perpendicular to the plane of the figure). The light source 6 is arranged on the circuit board 7. The light source 6 is electrically connected to the electrical wiring formed on the circuit board 7. The light source 6 radiates light toward the pressed surface 2a. In this embodiment, a light-emitting diode element is used as the light source 6. This, however, is not meant as any limitation; the light source 6 may instead be a semiconductor laser element, an organic light-emitting diode element, a halogen lamp, a mercury lamp, or the like.

In this embodiment, the turning on and off of the light source 6 is performed independently of the turning on and off of the power of the audio system with the operation button 2. The turning on and off of the light source 6 is performed, for example, in a manner coordinated with the turning on and off of lights of the vehicle.

Figure 4:
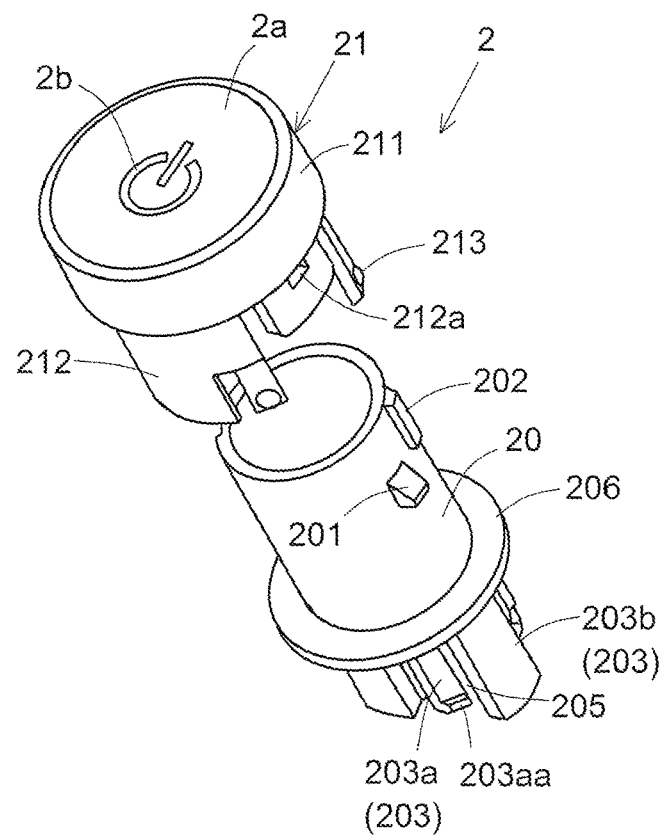
FIG. 4 is a schematic exploded perspective view of an operation button.
Figure 5:
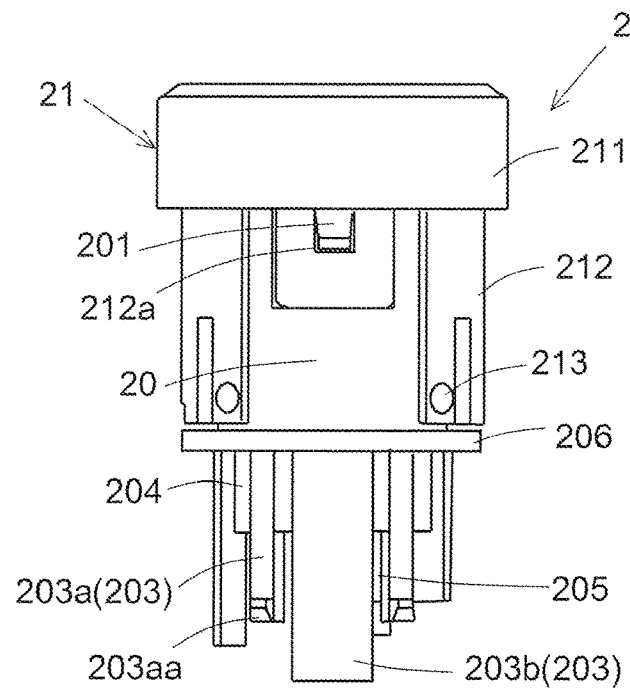
FIG. 5 is a schematic side view of an operation button.

2. Details of the Operation Button:

FIG. 4 is a schematic exploded perspective view of the operation button 2 according to an embodiment of the present invention. FIG. 5 is a schematic side view of the operation button 2 according to an embodiment of the present invention. As shown in FIG. 4, the operation button 2 has a body 20 in a tubular shape and a top 21. As shown in FIGS. 2, 4, and 5, the body 20 is, more specifically, in a cylindrical shape. The body 20 is formed of a material that does not transmit the light from the light source 6. The body 20 is formed of, for example, a black resin member.

The top 21 has the light-transmitting portion 2b, and is attached to the body 20 at its one end. In this embodiment, the top 21 is a cylindrical member that is closed at one end and is open at the other end. The direction in which the top 21 extends is the same as the direction in which the body 20 extends. At the closed side of the top 21, the pressed surface 2a having the light-transmitting portion 2b is arranged. With the open side of the top 21 pointing toward the body 20, the top 21 is fitted on the body 20. More specifically, the top 21 has a top body 211 in the shape of a bottomed case and a thin-walled protruding wall 212 protruding from the open end of the top body 211. The protruding wall 212 protrudes in the same direction as the direction in which the top 21 extends. The protruding wall 212 is composed of a plurality of protruding wall segments, and the plurality of protruding wall segments 212 are arranged next to, at intervals from, each other in the circumferential direction.

The body 20 and the top 21 are provided with a suitable engaging portion for positioning them relative to each other and fixing them together. In this embodiment, the body 20 has, on its outer circumferential surface, a first engagement projection 201 and a second engagement projection 202. The top 21 has, on the protruding wall 212, an engagement hole 212a that engages with the first engagement projection 201. The top 21 also has, in the inner circumferential surface of the top body 211, an unillustrated engagement groove that engages with the second engagement projection 202.

The top 21 is formed of an opaque-white resin member. The light-transmitting portion 2b is formed by first painting the obverse-side surface of the top 21 with predetermined paint and then removing, for example by laser processing, part of the painted coat to expose the opaque-white member. The predetermined paint is a paint that shields the transmission of light. The area painted with the predetermined paint can be determined arbitrarily, and does not necessarily have to be the entire area of the obverse side of the top 21. In this embodiment, only the obverse-side surface of the top body 211 is painted with the predetermined paint.

The top 21 has, on the outer circumferential surface, a plurality of spherical-surfaced convexities 213 arranged at intervals from each other in the circumferential direction. More specifically, the convexities 213 are formed on the protruding wall 212. In this embodiment, four of the convexities 213 are provided, but any other number of them may be provided. The four convexities 213 are arranged at equal intervals in the circumferential direction. Preferably, three or more of the convexities 213 are provided. The plurality of convexities 213 each make point contact with the inner circumferential surface of the operation dial 3. This permits the operation button 2 to be placed at a proper position relative to the operation dial 3. More specifically, the convexities 213 make contact with the middle ring 32 (see FIG. 2). The convexities 213 may instead be kept in contact with the inner ring 31, which is plated, but is preferably kept in contact with the middle ring 32. This helps reduce the probability of unusual noise accompanying the rotation of the operation dial 3.

The operation button 2 has, at the other end of the body 20, a plurality of legs 203 provided at intervals from each other in the circumferential direction. The other end of the body 20 is its end at which the top 21 is not attached. More specifically, the plurality of legs 203 extend in the same direction as the direction in which the body 20 extends. The plurality of legs 203 includes first legs 203a and second legs 203b that have different shapes from each other. Providing a plurality of types of legs with different shapes makes it possible to give them a plurality of functions. In this embodiment, four of the first legs 203a are provided, and three of the second legs 203b are provided. This, however, is merely an example, and any number of each may instead be provided.

In this embodiment, the first leg 203a has a narrower width in the circumferential direction than the second leg 203b. At the tip end of the first leg 203a, a hook 203aa is provided. The hook 203aa engages with an unillustrated engagement concavity or an engagement hole provided in the support member 4. That is, the first leg 203a functions as a stopper that prevents the operation button 2 from coming off the support member 4 easily. The first leg 203a is formed with a smaller width in the circumferential direction than the second leg 203b, and thus can be made easily deformable. This permits the operation button 2 to be attached to and detached from the support member 4 easily. The second leg 203b with a larger width engages with an unillustrated engagement groove provided in the support member 4. The second leg 203b engaging with the engagement groove permits the operation button 2 to be positioned relative to the support member 4 in the circumferential direction. That is, the second leg 203b functions as a positioner. With the first and second legs 203a and 203b engaged with the support member 4, the operation button 2 can move in the direction in which the body 20 extends (that is, the up-down direction in FIG. 2).

In this embodiment, at the base of the legs 203, there are provided couplings 204 that couple together adjacent ones of the first and second legs 203a and 203b. As the case may be, the couplings 204 may be omitted. The couplings 204 help reduce the spans of the gaps 205 left between the first and second legs 203a and 203b. Reducing the spans of the gaps 205 helps reduce the amount of light that leaks through the side of the body 20.

In this embodiment, the plurality of legs 203 further include a third leg 203c that has, at its tip end, a pusher 203ca (see FIG. 2). When the user presses the pressed surface 2a, the pusher 203ca presses the switch 5.

The operation button 2 has a flange 206 arranged between one end and the other end of the body 20. In this embodiment, the flange 206 is provided at the base of the legs 203, and protrudes from the outer circumferential surface of the body 20. This, however, is merely an example, and, as the case may be, the flange 206 may be provided at a position away from the legs 203. The flange 206 is provided around the entire outer circumference of the body 20. The flange 206 is in the shape of a circular ring. When the body 20 is seen along the direction in which it extends, the outer circumferential surface of the flange 206 is located outward of the legs 203 with respect to the center of the body 20. The outer circumference of the body 20 does not necessarily have to be in a circular shape, but may instead be in any other shape such as rectangular. The flange 206 is, preferably, a member integral with the body 20, but may be a member separate from it.

3. Workings and Effects of the Operation Device and the Operation Button:

In this embodiment, the operation button 2 is divided into two components: the body 20 and the top 21. The legs 203 provided in the body 20 include a plurality of types of legs, and have a complex structure. Owing to the body 20 and the top 21 being two separate components, the body 20 with the complex legs 203 can be mass-produced by resin molding.

Because the top 21 has the light-transmitting portion 2b, an attempt to make the body 20 and the top 21 a single component requires the component to be an opaque-white resin member or the like. In that case, to prevent light leakage, the body 20 including the legs 203 needs to be painted with paint. When the pressed surface 2a is pressed, the legs 203 slide relative to the support member 4. Thus, with the legs 203 painted with paint, the paint tends to come off and produce powder. The powder degrades the slidability of the legs 203, and possibly makes the operation button 2 unable to be pressed. In this respect, in this embodiment, owing to the body 20 and the top 21 being made as separate members, the body 20 does not need to be painted. Thus, with this embodiment, it is possible to reduce the risk of the operation button 2 becoming unable to be pressed.

Figure 6:
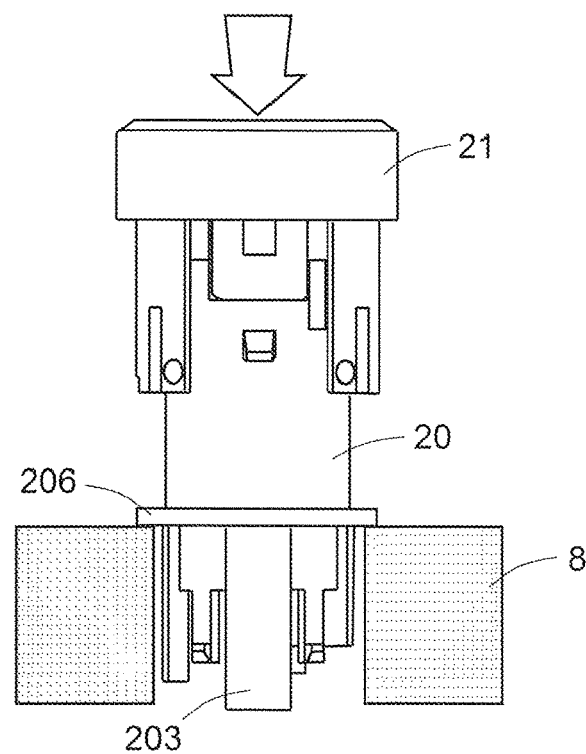
FIG. 6 is a schematic diagram showing an example of how an operation button is assembled.

The legs 203 in the body 20 are formed with precision to permit the operation button 2 to slide smoothly and properly relative to the support member 4. FIG. 6 is a schematic view showing an example of how the operation button 2 according to an embodiment of the present invention is assembled. As shown in FIG. 6, the body 20 can be supported, for example, on a ring-form panel 8 by placing the flange 206 on the panel 8. In this state, the top 21 can be attached to the body 20. Thus, when attaching the top 21 to the body 20, the worker can proceed with the work without touching the legs 203, which are formed with precision. Owing to the worker not touching the legs 203, it is possible to prevent deformation of the legs 203, and to prevent them from being contaminated with foreign matter. Owing to the flange 206 being prevented from deformation and from contamination with foreign matter, it is possible to suppress degradation of the slidability of the legs 203 relative to the support member 4. That is, it is possible to reduce the risk of the operation button 2 becoming unable to be pressed. Owing to the provision of the flange 206, the operation button 2 according to this embodiment provides improved handleability in assembly.

Figure 7A:
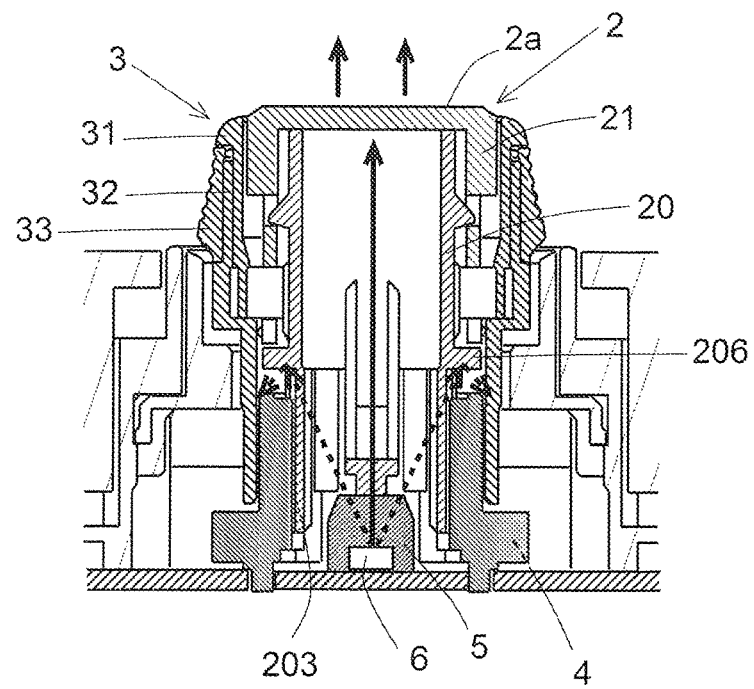
FIG. 7A is a diagram schematically showing how light travels from a light source.
Figure 7B:
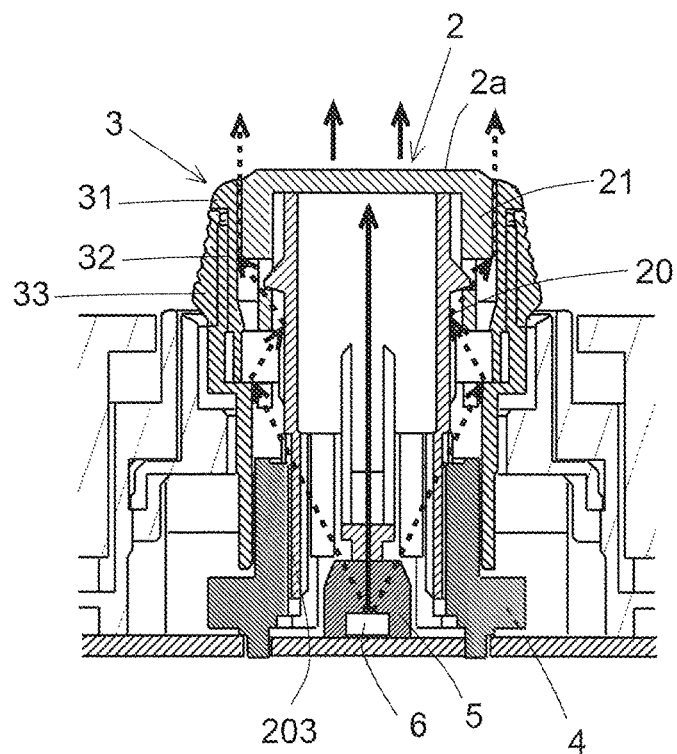
FIG. 7B is a diagram showing an example for comparison with what is shown in FIG. 7A.

FIG. 7A is a diagram schematically showing how light travels from the light source 6 in the operation device 1 according to an embodiment of the present invention. FIG. 7B is a diagram showing an example for comparison with what is shown in FIG. 7A, and schematically shows how light travels from the light source 6 without the provision of the flange 206.

The light source 6 radiates light toward the light-transmitting portion 2b from the legs 203 side. First, how light travels from the light source 6 in the case shown in FIG. 7B (comparison example) will be described. A large part of the light radiated from the light source 6 passes inside the body 20 and travels toward the pressed surface 2a, where the light-transmitting portion 2b is provided. Of the light, the part that has reached the light-transmitting portion 2b is transmitted through the top 21. This permits the user to visually recognize the power symbol. There are gaps 205 between the plurality of legs 203. Thus, part of the light radiated from the light source 6 passes through the gaps 205 and leaks out of the body 20. The light that has leaked out of the body 20 is reflected repeatedly on, for example, the inner circumferential surface of the operation dial 3 and the outer circumferential surface of the operation button 2, and eventually leaks out of the operation device 1 through the clearance between the operation dial 3 and the operation button 2. Thus, the user visually recognizes light other than the light that has been transmitted through the light-transmitting portion 2b. In this way, with the structure shown in FIG. 7B, light in the shape of a circular ring is visually recognized around the operation button 2.

In contrast, in the operation device 1 according to this embodiment, the operation button 2 has the flange 206. Thus, as shown in FIG. 7A, most of the light that has leaked out of the body 20 through the gaps 205 is reflected on the flange 206. Thus, in the operation device 1 according to this embodiment, it is possible to suppress the leakage of light through the clearance between the operation dial 3 and the operation button 2. Also in the operation device 1 according to this embodiment, the light radiated from the light source 6 and having passed inside the body 20 is transmitted through the light-transmitting portion 2b. Moreover, in this embodiment, the plated inner ring 31 extends deep into the housing 10. With this structure, even though light tends to leak through the clearance between the operation dial 3 and the operation button 2, with the flange 206, it is possible to effectively suppress light leakage.

4. Modifications Etc.:

The specific structures and features of the embodiments and modified examples described herein are merely examples of how the present invention can be implemented. Those structures and features allow for any modifications and variations made within the scope of the technical ingenuity involved in the present invention. Different embodiments and modified examples may be implemented in any combination as far as feasible.

In the embodiment described above, the flange 206 is formed around the entire outer circumference of the body 20, but this is merely an example. The flange 206 may be provided around part of the outer circumference of the body 20. For example, a flange can be arranged only at positions corresponding to where there are gaps 205, so that a plurality of flange segments are provided at intervals from each other around the outer circumference of the body 20. However, providing the flange 206 around the entire outer circumference is preferable, because that helps effectively suppress light leakage.

Although the above description deals with a case where the present invention is applied to an operation device for a vehicle-mounted audio system, this is not meant as any limitation; the present invention finds wide application in operation devices provided in car navigation devices, household electronic appliances, and the like.

What is claimed is:

1. An operation button, comprising:
a body in a tubular shape, the body being formed of a material that does not transmit light; and
a top having, as a part thereof, a light-transmitting portion and being attached to the body at one end thereof,
wherein the body includes:
a plurality of legs provided at another end of the body at intervals from each other in a circumferential direction; and
a flange arranged between the one end and the another end of the body.

2. The operation button according to claim 1, wherein the flange is provided around an entire outer circumference of the body, and
the flange has a circular outer circumference.

3. The operation button according to claim 1, wherein the plurality of legs include first and second legs having mutually different shapes.

4. The operation button according to claim 3, wherein the first leg has a smaller width in the circumferential direction than the second leg, and
a hook is provided at a tip end of the first leg.

5. An operation device, comprising:
the operation button according to claim 1;
an operation dial in a ring shape surrounding an outer circumference of the operation button;
a support member supporting the operation button such that the operation button is movable as the pressed surface is pressed;
a light source radiating light toward the light-transmitting portion; and
a switch turned on and off as the operation button moves,
wherein the flange reflects light radiated from the light source and passing through gaps between the plurality of legs.

6. The operation device according to claim 5, wherein the support member is an encoder.

7. An operation button, comprising:
a body in a tubular shape;
a top having a light-transmitting portion and being attached to the body at one end thereof;
a plurality of legs provided at another end of the body at intervals from each other in a circumferential direction; and
a flange arranged between the one end and the another end of the body,
wherein the top has, on an outer circumferential surface thereof, a plurality of spherical-surfaced convexities arranged at intervals from each other in the circumferential direction.

8. An operation button, comprising:
an operation button, comprising:
a body in a tubular shape;
a top having a light-transmitting portion and being attached to the body at one end thereof;
a plurality of legs provided at another end of the body at intervals from each other in a circumferential direction; and
a flange arranged between the one end and the another end of the body;

an operation dial in a ring shape surrounding an outer circumference of the operation button;
a support member supporting the operation button such that the operation button is movable as the pressed surface is pressed;
a light source radiating light toward the light-transmitting portion; and
a switch turned on and off as the operation button moves,
wherein the operation dial has, at an inner circumference thereof, a plated surface.

* * * * *